United States Patent [19]

Inagaki

[11] Patent Number: 5,619,340
[45] Date of Patent: Apr. 8, 1997

[54] VIDEO REPRODUCING APPARATUS HAVING FILTER CIRCUIT OF AUTOMATIC FREQUENCY ADJUSTMENT TYPE

[75] Inventor: Ryosuke Inagaki, Kyoto, Japan

[73] Assignee: ROHM Co., Ltd., Kyoto, Japan

[21] Appl. No.: 562,300

[22] Filed: Nov. 22, 1995

Related U.S. Application Data

[63] Continuation of Ser. No. 111,408, Aug. 25, 1993, abandoned.

[30] Foreign Application Priority Data

Aug. 26, 1992 [JP] Japan ..................... 4-226848

[51] Int. Cl.$^6$ ............... H04N 9/79; H04N 5/91
[52] U.S. Cl. ................................... 386/99
[58] Field of Search ..................... 358/320, 337, 358/341, 343; 360/19.1; 307/521; 328/167, 155; 381/68.2, 5, 10, 17, 103, 97

[56] References Cited

U.S. PATENT DOCUMENTS 4,438,405  3/1984  Yazawa et al. ................ 328/152
5,023,491  6/1991  Koyama ........................ 307/521

*Primary Examiner*—Thai Q. Tran
*Assistant Examiner*—Robert Chevalier
*Attorney, Agent, or Firm*—Nikaido, Marmelstein, Murry & Oram LLP

[57] ABSTRACT

A video cassette recorder has a plurality of filters for separating a reproduced audio signal into a left channel component and a right channel component. The plurality of filters are provided to each of the left and right channels. A phase comparator compares phases of input and output signals of one of the plurality of filters in at least one of the left and right channels, so that an error signal is produced. The error signal is supplied to each of the plurality of filters to control a frequency characteristic of each of the plurality of filters.

9 Claims, 5 Drawing Sheets

VIDEO REPRODUCING APPARATUS HAVING FILTER CIRCUIT OF AUTOMATIC FREQUENCY ADJUSTMENT TYPE

This application is a continuation of application Ser. No. 08/111,408 filed Aug. 25, 1993, now abandoned.

BACKGROUND OF THE INVENTION

1. Field of the Invention

The present invention relates to a video reproducing apparatus, and more particularly, to a video reproducing apparatus where a frequency characteristic of an audio filter circuit is automatically adjusted.

2. Description of the Prior Art

For example, a video cassette recorder (VCR) has a filter circuit in its circuit for processing an audio signal reproduced from a magnetic tape. In realizing such a filter circuit in the form of an integrated circuit (IC), since nonuniformity is generated among each filter circuit in the manufacture process, it is necessary to adjust the characteristics (frequencies) of the filter circuits. Conventionally, this adjustment was made by trimming an internal current or voltage from the outside by manually adjusting a variable resistor externally attached to the IC. According to this adjustment method, the circuit scale of the IC can be small; however, it has drawbacks because the externally attached part and adjustment thereof increases the cost.

Because of the drawbacks of the above method, another method is used in which the adjustment is automatically made by an automatic adjusting circuit provided in the IC. FIG. 1 shows a conventional automatic frequency adjusting circuit for a filter circuit provided in a VCR for separating a reproduced FM audio signal into an left (L) channel component and a right (R) channel component. In FIG. 1, an FM audio signal reproduced from a video track of a magnetic tape 1 by a rotary magnetic head 2 is input to a terminal 3. After the signal has passed through a buffer 4, a luminance signal component is removed from the signal at a low-pass filter 5. Then, the signal is supplied by way of a buffer 6 to band-pass-type first and second filter circuits 7 and 8.

The first and second filter circuits 7 and 8 are provided for separating an L channel signal and an R channel signal from each other. The first filter circuit 7 is formed to have a band whose center frequency is 1.3 MHz. The first filter circuit 7 is constituted by a low-pass filter 7A, a trap filter 7B, a high-pass filter 7C, a trap filter 7D and a band pass filter 7E. The characteristics of the filters 7A to 7E are shown in A to E of FIG. 2, respectively. Likewise, the second filter 8 is constituted by a low-pass filter 8A, a trap filter 8B, a high-pass filter 8C, a trap filter 8D, a band pass filter 8E, which also have characteristics shown in FIG. 2. Outputs of the first and second filter circuits 7 and 8 are directed by way of amplifiers 9 and 10 to output terminals 11 and 12, respectively. To each of the output terminals 11 and 12, an FM demodulator (not shown) is connected.

Since the filter circuits 7 and 8 have high frequencies (1.3 MHz and 1.7 MHz, respectively), even slight nonuniformities or errors generated in the circuit devices constituting the filter circuits 7 and 8 lead to a large frequency difference. For example, a 1% frequency deviation leads to a 13 kHz center frequency deviation in the first filter circuit 7. In the second filter circuit 8, it leads to a 17 kHz deviation. Thus, the difference from the input FM signal is quite large. That is, since in VCRs, for example, with respect to a standard level, the modulation factor for the center frequencies of 1.3 MHz and 1.7 Mhz is 50 kHz, the 13 kHz and 17 kHz frequency deviations of the filter circuits due to the nonuniformities are very large compared to 50 kHz. This causes problems of a hoarse sound and an inaccurate signal level. In order to compensate for the nonuniformities, an arrangement for automatically adjusting a frequency is added. This arrangement is as follows: a 3.58 MHz color subcarrier provided to a terminal 13 is amplified by an amplifier 14, and after an amplitude thereof is limited by a limiter 15, the color subcarrier is provided by way of a low-pass filter 16 and an attenuator 17 to reference filters 18 and 19 and to a phase comparator 20. The phase comparator 20 compares a phase of an output signal of the low-pass filter 16 and a phase of an output signal of the reference filter 19, and provides a comparison output (error signal) by way of a low-pass filter 21 and a controlling circuit 22 to the low-pass filter 16 and to the reference filters 18 and 19 to control so that the error signal becomes 0.

The error signal is also provided from the controlling circuit 22 to the filters 7A to 7E and 8A and 8E constituting the filter circuits 7 and 8 to control frequency characteristics of the filters. In the automatic frequency adjusting circuit of FIG. 1, by providing to a secondary low-pass filter constituted by the reference filters 18 and 19 an arrangement the same as that of the filters 7A to 7E and 8A to 8E, frequency characteristics of the first and second filter circuits 7 and 8 are also controlled by use of a controlling signal (phase comparison output) for controlling to be 90° the phases of an input signal and an output signal of the secondary low-pass filter constituted by the reference filters 18 and 19. The low-pass filter 21 is for converting the error signal to a direct current, while the controlling circuit 22 is for temperature compensation. Numerals 24 and 26 are a capacitor and a resistor which are externally attached to terminals 23 and 25, respectively.

In the above-described conventional automatic frequency adjusting circuit, however, since the 1.3 MHz and 1.7 MHz filter circuits are adjusted by an adjusting signal generated by use of a 3.58 MHz signal, a 2 MHz frequency difference originally exists between an adjusting signal generating system and an adjusted system. As a result, it is impossible to provide precise adjustment. Since in a VCR, a 15.75 kHz horizontal synchronizing signal is present in addition to the 3.58 MHz color subcarrier, it is possible to generate an adjusting signal by use of the horizontal synchronizing signal instead of the color subcarrier. However, since the frequency difference from the adjusted system is also large in that case, the same problem occurs.

That it is impossible to provide precise adjustment means that the overall characteristic of the filter circuit 7 or 8 is automatically adjusted to be not a proper characteristic 50 but a characteristic 51 shown in FIG. 3. When adjustment is made in such a manner, since the frequency relationship of the input FM audio signal originally corresponds to the characteristic 50, if trap portions b0 and d0 which have frequencies to attenuate input signals are shifted to portions b and d, respectively, input signals which are present at the portions b and d are mostly attenuated. As a result, the signal-to-noise (S/N) ratio largely deteriorates. Moreover, the conventional automatic frequency adjusting circuit has drawbacks since its circuit scale is quite large.

SUMMARY OF THE INVENTION

An object of the present invention is to provide a video reproducing apparatus having a filter circuit of an automatic frequency adjustment type, the filter circuit being of comparatively small scale and providing precise adjustment.

To achieve the above-mentioned object, a video reproducing apparatus of the present invention is provided with a plurality of filters for separating a reproduced audio signal into a left channel component and a right channel component, the plurality of filters being provided to each of left and right channels, a phase comparator for comparing phases of input and output signals of one of the plurality of filters in one of the left and right channels, and means for supplying an output of the phase comparator to each of the plurality of filters to control a frequency characteristic of each of the plurality of filters.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
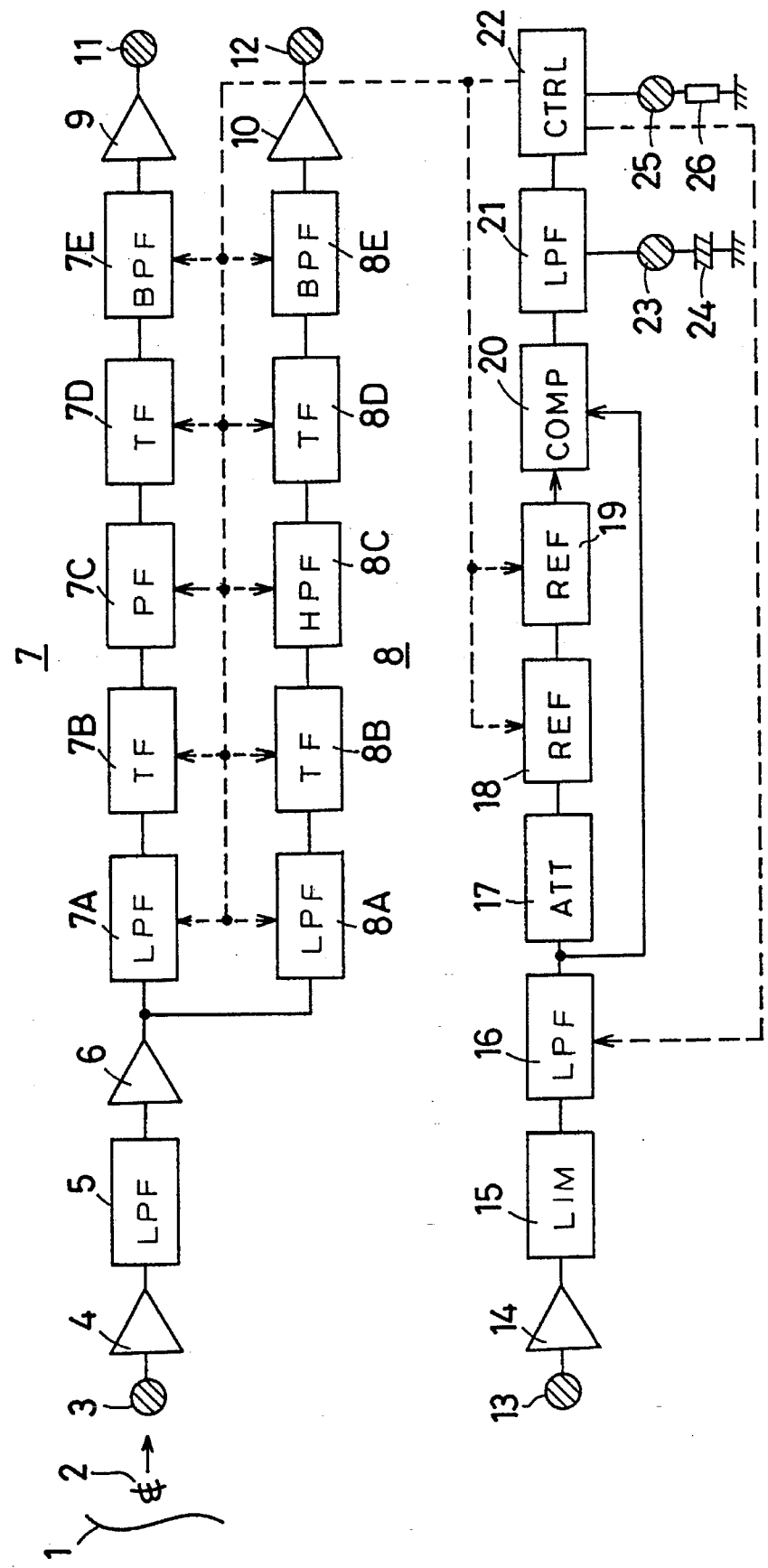
FIG. 1 is a circuit diagram showing a filter circuit and an automatic frequency adjusting circuit for use in a conventional VCR.
Figure 2:
FIG. 2 shows frequency characteristics of filters constituting the filter circuit of FIG. 1.
Figure 3:
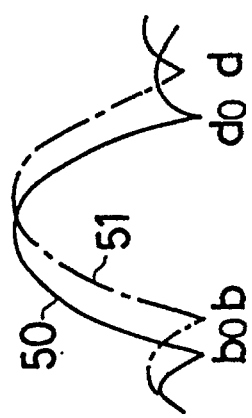
FIG. 3 shows a general characteristic of the filter circuit of FIG. 1.
Figure 4:
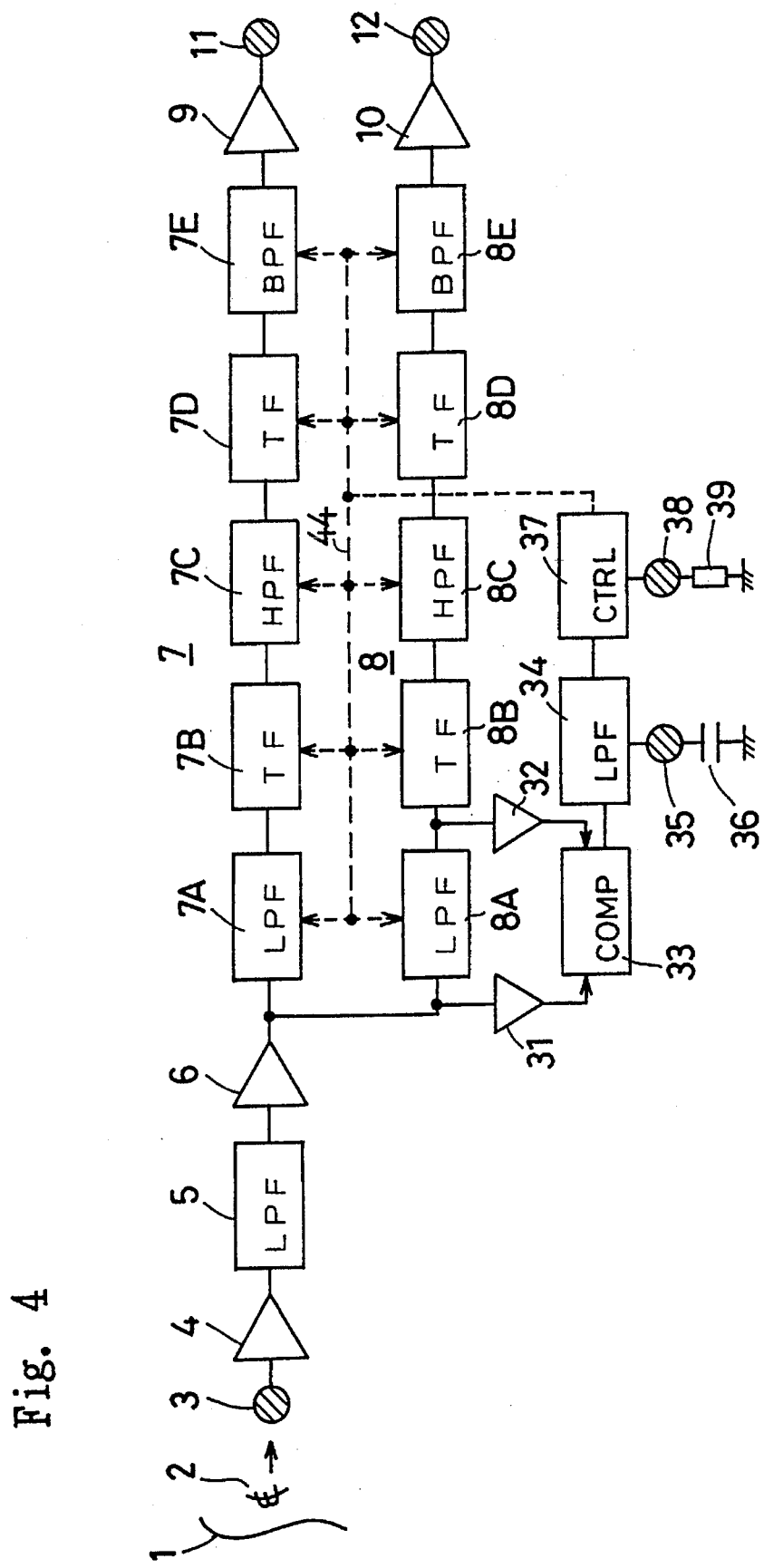
FIG. 4 is a circuit diagram showing a filter circuit and an automatic frequency adjusting circuit for use in a VCR embodying the present invention.
Figure 5:
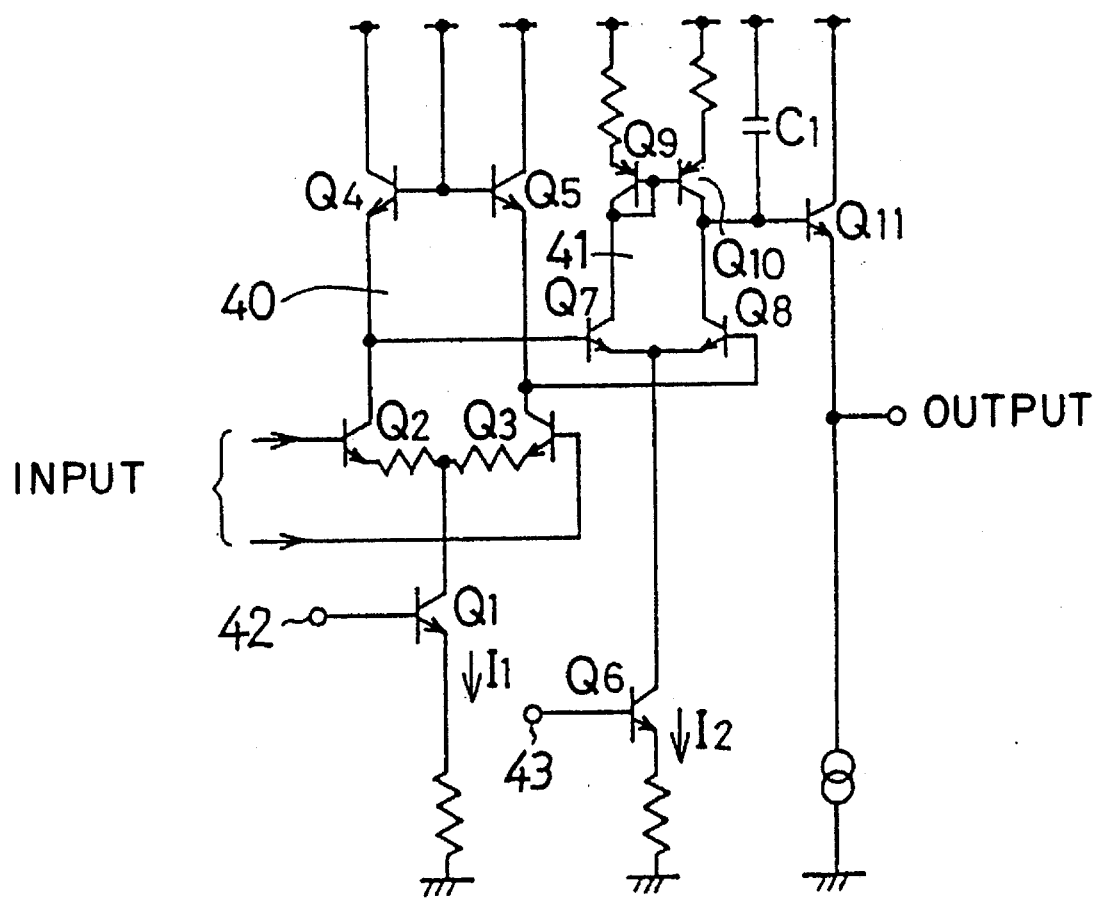
FIG. 5 shows an arrangement of a part of the circuit of FIG. 4.
Figure 6:
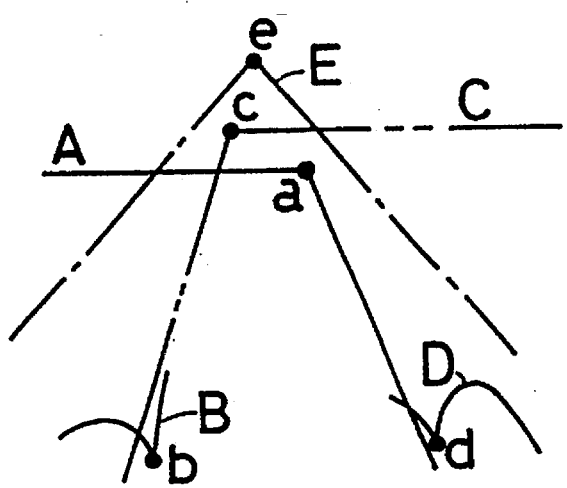
FIG. 6 is a view for explaining adjustment points of the circuit of FIG. 4

The present invention will hereinafter be described with reference to FIGS. 4 to 6. FIG. 4 shows a filter circuit for separating a reproduced FM audio signal into an L channel component and an R channel component, and an automatic frequency adjusting circuit for adjusting a frequency characteristic of the filter circuit in a VCR. In the figure, an FM audio signal reproduced from a video track of a magnetic tape 1 by a rotary magnetic head 2 is input to a terminal 3. After the signal has passed through a buffer 4, a luminance signal component is removed from the signal at a low-pass filter 5. Thereafter, the signal is supplied by way of a buffer 6 to band-pass-type first and second filter circuits 7 and 8. The first and second filter circuits 7 and 8 are provided for separating an L channel signal component and an R channel signal component from each other. The first filter circuit 7 is constituted by serially connecting a low-pass filter 7A, a trap filter 7B, a high-pass filter 7C, a trap filter 7D and a band pass filter 7E. The characteristics of the filters 7A to 7E are shown in A to E of FIG. 2, respectively. Likewise, the second filter 8 is constituted by serially connecting a low-pass filter 8A, a trap filter 8B, a high-pass filter 8C, a trap filter 8D, a band pass filter 8E, which also have characteristics shown in FIG. 2. Outputs of the first and second filter circuits 7 and 8 are directed by way of amplifiers 9 and 10 to output terminals 11 and 12, respectively. To each of the output terminals 11 and 12, an FM demodulator (not shown) is connected. The filter circuits 7 and 8 have high center frequencies (1.3 MHz and 1.7 MHz, respectively).

In this embodiment, an input signal and an output signal of the low-pass filter 8A of the second filter circuit 8 is provided to a phase comparator 33 by way of amplifiers 31 and 32, respectively, and by a comparison output (error signal) of the phase comparator 33, a cut-off frequency of the filter 8A is adjusted and frequencies of the filters 7A to 7E and 8A to 8E are automatically adjusted. At this time, the filter 8A is constructed so that there is a substantially 90° phase difference between at its input and output terminals. The cut-off frequency thereof is set to be slightly higher than 1.7 MHz. Numeral 34 is a low-pass filter for smoothing an output of the phase comparator 33. The low-pass filter 34 is connected to an externally attached capacitor 36 through a terminal 35. Numeral 37 is a temperature compensating circuit for offsetting variations of the filters 7A to 7E and 8A to 8E due to a temperature characteristic. Each of the filters 7A to 7E and 8A to 8E are constituted by a differential-amplifier-type gm amplifiers 40 and 41 and a capacitor C1 as shown in FIG. 5. The frequency characteristic is adjusted by controlling a constant current $I_1$ or $I_2$ of the gm amplifier 40 or 41 by use of the output of the phase comparator 33. In this case, the output of the phase comparator 33 is provided to a terminal 42 (or 43). In FIG. 4, the broken line 44 shows an adjusting signal path to each filter. FIG. 6 shows characteristics A to E of the filters 8A to 8E of the second filter circuit 8. Points a to e show adjustment points controlled by the adjusting signal. In this case, since the adjusting signal (error signal) is obtained from a frequency corresponding to the point a, a frequency of an adjusting signal generating system (a) and that of an adjusted system (a, b, c, d and e) are close to each other, and accordingly, a correctly adjusted state is realized.

While the adjusting signal is produced with respect to the filter 8A in the above embodiment, it may be produced with respect to another filter (e.g. filter 8B or filter 7A). While in the above embodiment, the center frequencies of the first and second filter circuits 7 and 8 are 1.3 MHz (left channel) and 1.7 MHz (right channel), respectively, since the embodiment is for use in an NTSC (national television system committee) VHS system VCR. In the case of a PAL (phase alternation by line) VCR, since the center frequencies of the left and right channels are 1.4 MHz and 1.8 MHz, respectively, the center frequencies of the first and second filter circuits 7 and 8 are set to be 1.4 MHz and 1.8 MHz, respectively. In the case of an 8 m/m VCR, the center frequencies of the first and second filter circuits 7 and 8 are set to be 1.5 MHz and 1.7 MHz, respectively, for both NTSC and PAL.

As described above, according to the present invention, since a frequency of an adjusting signal generating system and a frequency of an adjusted system are close to each other, it is possible to provide precise adjustment. Further, a circuit for generating an adjusting signal is of a simple arrangement compared to a conventional circuit where a signal of a separate frequency is used.

Obviously, many modifications and variations of the present invention are possible in light of the above teachings. It is therefore to be understood that within the scope of the appended claims, the invention may be practiced other than as specifically described.

What is claimed is:

1. A video reproducing apparatus comprising:

a plurality of filters for separating a reproduced audio signal into a left channel component for a left channel and a right channel component for a right channel, said plurality of filters being provided to each of said left and right channels, said filters for each channel being connected in series between an input terminal and an output terminal for the reproduced audio signal;

a phase comparator connected to an input and an output of one of the plurality of filters, said phase comparator for comparing phases of input and output signals from said one of the plurality of filters in one of the left and right channels; and means for supplying an output of the phase comparator to each of the plurality of filters to control a frequency characteristic of each of the plurality of filters.

2. A video reproducing apparatus according to claim 1, wherein each of said plurality of filters includes a differential amplifier and a capacitor and wherein a constant current of said differential amplifier is controlled by said output of said phase comparator.

3. A video reproducing apparatus according to claim 1, wherein said one of the plurality of filters whose input and output signals are phase-compared is a filter located at a forefront of the channel.

4. A video reproducing apparatus according to claim 1, wherein said one of the plurality of filters whose input and output signals are phase-compared is a low-pass filter.

5. A video reproducing apparatus according to claim 1, wherein each channel includes a low-pass filter, a first trap filter, a high-pass filter, a second trap filter and a band pass filter and wherein said one of the plurality of filters whose input and output signals are phase-compared is said low-pass filter.

6. A video reproducing apparatus according to claim 1, wherein said reproduced audio signal is an FM audio signal reproduced from a video track of a magnetic tape.

7. A video reproducing apparatus comprising:

a filter circuit including a plurality of filters, said plurality of filters being connected in series, wherein a reproduced signal passes through the filters;

a phase comparator connected to an input and an output of one of the plurality of filters, said phase comparator for comparing phases of input and output signals from said one of the plurality of filters; and means for supplying an output of the phase comparator to each of the plurality of filters to control a frequency characteristic of each of the plurality of filters.

8. A video reproducing apparatus comprising:

a plurality of filters for separating a reproduced audio signal into a left channel component for a left channel and a right channel component for a right channel, said plurality of filters being provided to each of said left and right channels, said filters for each channel being connected in series between an input terminal and an output terminal for the reproduced audio signal and characteristics of the filters are different from each other;

a phase comparator connected to an input and an output of one of the plurality of filters, said phase comparator for comparing phases of input and output signals from said one of the plurality of filters in one of the left and right channels; and means for supplying an output of the phase comparator to each of the plurality of filters to control a frequency characteristic of each of the plurality of filters.

9. A video reproducing apparatus according to claim 8, wherein an adjustment point of said one of the plurality of filters to be adjusted by the comparator is in the vicinity of every one of adjustment point of other filters.

* * * * *